US007176845B2

(12) United States Patent
Fabrega-Sanchez et al.

(10) Patent No.: US 7,176,845 B2
(45) Date of Patent: Feb. 13, 2007

(54) SYSTEM AND METHOD FOR IMPEDANCE MATCHING AN ANTENNA TO SUB-BANDS IN A COMMUNICATION BAND

(75) Inventors: Jorge Fabrega-Sanchez, San Diego, CA (US); Gregory Poilasne, San Diego, CA (US); Stanley S. Toncich, San Diego, CA (US); Allen Tran, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 10/899,218

(22) Filed: Jul. 26, 2004

(65) Prior Publication Data

US 2005/0007291 A1    Jan. 13, 2005

Related U.S. Application Data

(63) Continuation-in-part of application No. 10/117,628, filed on Apr. 4, 2002, now Pat. No. 6,861,985, and a continuation-in-part of application No. 10/120,603, filed on Apr. 9, 2002, now Pat. No. 6,885,341, and a continuation-in-part of application No. 10/075,896, filed on Feb. 12, 2002, now Pat. No. 6,765,540.

(51) Int. Cl.
*H01Q 1/50* (2006.01)
(52) U.S. Cl. .................................. 343/861; 455/575.7
(58) Field of Classification Search ................ 343/850, 343/860, 861; 455/575.7
See application file for complete search history.

(56) References Cited

U.S. PATENT DOCUMENTS 3,239,838 A    3/1966   Kelleher
3,413,543 A    11/1968  Schubring et al.
3,569,795 A    3/1971   Gikow (Continued)

FOREIGN PATENT DOCUMENTS

DE    40 36 866 A1    7/1991

(Continued)

OTHER PUBLICATIONS

Presser, A., "Varactor-Tunable, High-Q Microwave Filter," RCA Review, vol. 42, Dec. 1981, pp. 691-705.

(Continued)

*Primary Examiner*—Michael C. Wimer

(57) ABSTRACT

A sub-band antenna matching method and an antenna matching system for selectively matching a communication bandwidth segment impedance have been provided. The method comprises: accepting a frequency-dependent impedance from an antenna; and, selectively supplying a conjugate impedance match for the antenna at a sub-band of a first communication band. In some aspects, the method selectively supplies a conjugate impedance match for the antenna at a sub-band of a second communication band. More specifically, the method comprises: tuning a first tuning circuit to a first frequency; simultaneously tuning a second tuning circuit to a second frequency to match the antenna at a low end of the first communication band. Likewise, the first tuning circuit is tuned to a third frequency and the second tuning circuit is tuned to a fourth frequency to match the antenna at a high end of the first communication band in response to the third and fourth frequencies.

32 Claims, 10 Drawing Sheets

U.S. PATENT DOCUMENTS

| | | |
|---|---|---|
| 3,676,803 A | 7/1972 | Simmons |
| 3,678,305 A | 7/1972 | Paige |
| 3,680,135 A * | 7/1972 | Boyer .................. 343/742 |
| 3,737,814 A | 6/1973 | Pond |
| 3,739,299 A | 6/1973 | Adler |
| 3,836,874 A | 9/1974 | Maeda et al. |
| 3,918,012 A | 11/1975 | Peuzin |
| 4,122,400 A | 10/1978 | Medendorp et al. |
| 4,236,125 A | 11/1980 | Bernard et al. |
| 4,475,108 A | 10/1984 | Moser |
| 4,484,157 A | 11/1984 | Helle et al. |
| 4,494,081 A | 1/1985 | Lea et al. |
| 4,525,720 A | 6/1985 | Corzine et al. |
| 4,626,800 A | 12/1986 | Murakami et al. |
| 4,733,328 A | 3/1988 | Blazej |
| 4,736,169 A | 4/1988 | Weaver et al. |
| 4,737,797 A | 4/1988 | Siwiak et al. |
| 4,746,925 A | 5/1988 | Toriyama |
| 4,792,939 A | 12/1988 | Hikita et al. |
| 4,799,066 A | 1/1989 | Deacon |
| 4,835,499 A | 5/1989 | Pickett |
| 4,835,540 A | 5/1989 | Haruyama et al. |
| 4,847,626 A | 7/1989 | Kahler et al. |
| 4,975,604 A | 12/1990 | Barta |
| 5,166,857 A | 11/1992 | Avanic et al. |
| 5,173,709 A | 12/1992 | Lauro et al. |
| 5,212,463 A | 5/1993 | Babbitt et al. |
| 5,216,392 A | 6/1993 | Fraser |
| 5,227,748 A | 7/1993 | Sroka |
| 5,231,407 A | 7/1993 | McGirr et al. |
| 5,293,408 A | 3/1994 | Takahashi et al. |
| 5,307,033 A | 4/1994 | Koscica et al. |
| 5,325,099 A | 6/1994 | Nemit et al. |
| 5,388,021 A | 2/1995 | Stahl |
| 5,406,163 A | 4/1995 | Carson et al. |
| 5,416,803 A | 5/1995 | Janer |
| 5,427,988 A | 6/1995 | Sengupta et al. |
| 5,450,092 A | 9/1995 | Das |
| 5,451,915 A | 9/1995 | Katzin et al. |
| 5,459,123 A | 10/1995 | Das |
| 5,472,935 A | 12/1995 | Yandrofski et al. |
| 5,479,139 A | 12/1995 | Koscica et al. |
| 5,495,215 A | 2/1996 | Newell et al. |
| 5,496,795 A | 3/1996 | Das |
| 5,496,796 A | 3/1996 | Das |
| 5,502,422 A | 3/1996 | Newell et al. |
| 5,525,942 A | 6/1996 | Horii et al. |
| 5,557,286 A | 9/1996 | Varadan et al. |
| 5,561,307 A | 10/1996 | Mihara et al. |
| 5,561,407 A | 10/1996 | Koscica et al. |
| 5,564,086 A | 10/1996 | Cygan et al. |
| 5,574,410 A | 11/1996 | Collins et al. |
| 5,577,025 A | 11/1996 | Skinner |
| 5,583,524 A | 12/1996 | Milroy |
| 5,589,845 A | 12/1996 | Yandrofski |
| 5,600,279 A | 2/1997 | Mori |
| 5,617,104 A | 4/1997 | Das |
| 5,640,042 A | 6/1997 | Koscica et al. |
| 5,649,306 A | 7/1997 | Vanatta et al. |
| 5,652,599 A | 7/1997 | Wallace et al. |
| 5,673,188 A | 9/1997 | Lusher et al. |
| 5,701,595 A | 12/1997 | Green, Jr. |
| 5,721,194 A | 2/1998 | Yandrofski et al. |
| 5,729,239 A | 3/1998 | Rao |
| 5,777,524 A | 7/1998 | Wojewoda et al. |
| 5,777,839 A | 7/1998 | Sameshina et al. |
| 5,778,308 A | 7/1998 | Sroka et al. |
| 5,830,591 A | 11/1998 | Sengupta et al. |
| 5,834,975 A | 11/1998 | Bartlett et al. |
| 5,864,932 A | 2/1999 | Evans et al. |
| 5,870,670 A | 2/1999 | Ripley |
| 5,880,921 A | 3/1999 | Tham et al. |
| 5,892,486 A | 4/1999 | Cook et al. |
| 5,908,811 A | 6/1999 | Das |
| 5,945,887 A | 8/1999 | Makino et al. |
| 5,965,494 A | 10/1999 | Terashima et al. |
| 5,973,567 A | 10/1999 | Heal et al. |
| 5,973,568 A | 10/1999 | Shapiro et al. |
| 5,986,515 A | 11/1999 | Sakurai |
| 5,987,314 A | 11/1999 | Saito |
| 5,990,766 A | 11/1999 | Zhang |
| 6,008,659 A | 12/1999 | Traynor |
| 6,018,282 A | 1/2000 | Tsuda |
| 6,020,787 A | 2/2000 | Kim et al. |
| 6,026,311 A | 2/2000 | Willemsen Cortes et al. |
| 6,028,561 A | 2/2000 | Takei |
| 6,049,726 A | 4/2000 | Gruenwald et al. |
| 6,052,036 A | 4/2000 | Enstrom et al. |
| 6,054,908 A | 4/2000 | Jackson |
| 6,063,719 A * | 5/2000 | Sengupta et al. ........... 501/137 |
| 6,094,588 A | 7/2000 | Adam |
| 6,097,263 A | 8/2000 | Mueller et al. |
| 6,101,102 A | 8/2000 | Brand et al. |
| 6,108,191 A | 8/2000 | Bruchhaus et al. |
| 6,160,524 A | 12/2000 | Wilber |
| 6,181,777 B1 | 1/2001 | Kiko |
| 6,198,441 B1 | 3/2001 | Okabe |
| 6,216,020 B1 | 4/2001 | Findikoglu |
| 6,242,843 B1 | 6/2001 | Pohjonen et al. |
| 6,272,336 B1 | 8/2001 | Appel et al. |
| 6,278,383 B1 | 8/2001 | Endo et al. |
| 6,281,023 B2 | 8/2001 | Eastep et al. |
| 6,281,534 B1 | 8/2001 | Arita et al. |
| 6,285,337 B1 | 9/2001 | West et al. |
| 6,292,143 B1 | 9/2001 | Romanofsky |
| 6,294,964 B1 | 9/2001 | Satoh |
| 6,308,051 B1 | 10/2001 | Atokawa |
| 6,327,463 B1 | 12/2001 | Welland |
| 6,329,959 B1 | 12/2001 | Varadan et al. |
| 6,333,719 B1 | 12/2001 | Varadan |
| 6,335,710 B1 | 1/2002 | Falk et al. |
| 6,344,823 B1 | 2/2002 | Deng |
| 6,359,444 B1 | 3/2002 | Grimes |
| 6,362,784 B1 | 3/2002 | Kane et al. |
| 6,362,789 B1 | 3/2002 | Trumbull et al. |
| 6,384,785 B1 | 5/2002 | Kamogawa et al. |
| 6,404,304 B1 | 6/2002 | Kwon et al. |
| 6,456,236 B1 | 9/2002 | Hauck et al. |
| 6,462,628 B2 | 10/2002 | Kondo et al. |
| 6,489,860 B1 | 12/2002 | Ohashi |
| 6,503,786 B2 | 1/2003 | Klodzinski |
| 6,518,850 B1 | 2/2003 | Falk et al. |
| 6,518,920 B2 | 2/2003 | Proctor, Jr. et al. |
| 6,522,220 B2 | 2/2003 | Yamada et al. |
| 6,525,630 B1 | 2/2003 | Zhu et al. |
| 6,525,691 B2 | 2/2003 | Varadan et al. |
| 6,531,936 B1 | 3/2003 | Chiu et al. |
| 6,559,737 B1 | 5/2003 | Nagra et al. |
| 6,571,110 B1 | 5/2003 | Patton et al. |
| 6,600,456 B2 | 7/2003 | Gothard et al. |
| 6,653,977 B1 | 11/2003 | Okabe et al. |
| 6,667,723 B2 | 12/2003 | Forrester |
| 6,686,817 B2 | 2/2004 | Zhu et al. |
| 6,721,293 B1 | 4/2004 | Komulainen et al. |
| 6,727,535 B1 | 4/2004 | Sengupta et al. |
| 2001/0026243 A1 | 10/2001 | Koitsalu et al. |
| 2001/0043159 A1 | 11/2001 | Masuda et al. |
| 2002/0049064 A1 | 4/2002 | Banno |
| 2002/0149526 A1 | 10/2002 | Tran et al. |
| 2002/0149535 A1 | 10/2002 | Toncich |
| 2002/0175878 A1 | 11/2002 | Toncich |
| 2003/0062971 A1 | 4/2003 | Toncich |
| 2003/0134665 A1 | 7/2003 | Kato et al. |
| 2004/0196121 A1 | 10/2004 | Toncich |

| | | | |
|---|---|---|---|
| 2004/0263411 | A1 | 12/2004 | Fabrega-Sanchez et al. |
| 2005/0007291 | A1 | 1/2005 | Fabrega-Sanchez et al. |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 A1 | 2/1995 |
| EP | 0 638 953 A1 | 2/1995 |
| EP | 0 680 108 A1 | 11/1995 |
| EP | 0 795 922 A1 | 9/1997 |
| EP | 0 843 374 A2 | 5/1998 |
| EP | 0 854 567 | 7/1998 |
| EP | 0 872 953 | 10/1998 |
| EP | 0 881 700 A1 | 12/1998 |
| EP | 0 892 459 | 1/1999 |
| EP | 0 909 024 A2 | 4/1999 |
| EP | 1 043 741 A2 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 290500-2001133839 | 7/2001 |
| WO | WO 82/03510 | 10/1982 |
| WO | WO 94/13028 | 6/1994 |
| WO | WO 94/27376 | 11/1994 |
| WO | WO 00/28613 | 5/2000 |
| WO | WO 00/35042 | 6/2000 |
| WO | WO 00/62367 | 10/2000 |
| WO | WO 00/79645 A1 | 12/2000 |
| WO | WO 00/79648 A1 | 12/2000 |
| WO | WO 03/058759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.

Katzin, P. et al., "Narrow-band MMIC Filters with Automatic Tuning and Q-Factor Control," 1993 IEEE MTT-S Int. Microwave Symposium Digest, pp. 403-406.

Hopf, B. et al., "Coplanar MMIC Active Bandpass Filters Using Negative Resistance Circuits," 1994 IEEE MTT-S Symposium Digest, pp. 1183-1185.

Karacaoglu, U. et al., "High Selectivity Varactor-Tuned MMIC Bandpass Filter Using Lossless Active Resonators," 1994 IEEE MTT-Symposium Digest, pp. 1191-1194.

Nauta, B., "A CMOS-Transconductance-C Filter Technique for Very High Frequencies," IEEE Journal of Solid-State Circuits, vol. 27, No. 2, Feb. 1992, pp. 142-153.

Fujita, K. et al., "A 15.6 GHz Commercially Based 1/8 GaAs Dynnamic Presealer," 1989 IEEE GaAs IC Symposium, pp. 113-116.

Smuk, J. et al., "MMIC Phase Locked L-S Band Oscillators," 1994 IEEE GaAs Symposium Digest, pp. 27-29.

Chandler, S.R. et al., "Active Varactor Tunable Bandpass Filter," IEEE Microwave and Guided Wave Letters, vol. 3, No. 3, Mar. 1993. pp. 70-71.

Hunter, I.C. et al., "Electronically Tunable Microwave Bandpass Filters," IEEE Trans. on MTT, vol. 30, No. 9, Sep. 1982, pp. 1354-1367.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Yu, B., "Variety of Approaches to Designing Microwave Active Filters," Proc. 27th European Microwave Conference, Jerusalem, vol. 1, 1997, pp. 397-408.

Yu, B., "Understand the Operation of Channelized Active Filters," Microwaves & RF, Jan. 1997, pp. 89-92.

Dishal, M., "Alignment and Adjustment of Synchronously Tuned Multiple Resonator-Circuit Filters," Proc. IRE 39, Nov. 1951, pp. 1448-1455.

Cohn, S.B., "Dissipation Loss in Multiple-Coupled-Resonator Filters," Proc. IRE 47, Aug. 1959, pp. 1342-1348.

Matthaei; G.L., "An Electronically Tunable Up-Converter," Proc. IRE 49, Nov. 1961, pp. 1703-1704.

Fubini, E.G. et al., "Minimum Insertion Loss Filters," Proc. IRE 47, Jan. 1959, pp. 37-41.

Getsinger, W.J., "Prototypes for Use in Broadbanding Reflection Amplifiers," IEEE Trans. PTGMTT-11, Nov. 1963, pp. 486-497.

Kuh, E.S. et al., "Optimum Sunthesis of Wide-Band Parametric Amplifiers and Converters," IRE Trans. PCCT-8, Dec. 1961, pp. 410-415.

Getsinger, W.J. et al., "Some Aspects of the Design of Wide-Band Up-Converters and Nondegenerate Parametric Amplifiers," IEEE Trans. PTGMTT-12, Jan. 1964, pp. 77-87.

Steven, R.L., "Design of a Tunable Multi-Cavity Waveguide Band-Pass Filter," 1959 IRE National Convention Record, Part 3, pp. 91-112.

Taub, J.J. et al., "Design of Three-Resonator Dissipative Band-Pass Filters Having Minimum Insertion Loss," Proc. IRE 45, pp. 681-687 (May 1957).

Kotzebue, K.L., "Broadband Electronically-Tunable Microwave Filters," 1960 IRE Wescon Convention Record, Part 1, pp. 21-27.

Louhos, J.P. et al., "Electrical Tuning of Integrated Mobile Phone Antennas," Nokia Mobile Phones, pp. 69-97 (Sep. 15, 1999).

Panayi, P.K. et al., "Tuning Techniques for the Planar Inverted-F Antenna," National Conference on Antennas and Propagation Publication, No. 461, pp. 259-262, (Apr. 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.

Varadan, V.K. et al., "Design and Development of Electronically Tunable Microstrip Antennas," IOP Publishing Ltd., pp. 238-242, (1999).

Communication Relating to the Results of the Partial International Search: PCT/IB02/01077 (2002).

Jose et al., "Experimental Investigations on Electronically Tunable Microstrip Antennas," Microwave and Optical Technology Letters, vol. 20, No. 3, pp. 166-169 (Feb. 5, 1999).

International Search Report: PCT/IB 02/01086 (Jun. 24, 2002).
International Search Report: PCT/IB 02/01078 (Jul. 10, 2002).
International Search Report: PCT/IB 02/01087 (Jul. 11, 2002).
International Search Report: PCT/IB 02/01107 (Jul. 11, 2002).
International Search Report: PCT/IB 02/01120 (Jul. 11, 2002).
International Search Report: PCT/IB 02/01098 (Jul. 4, 2002).
International Search Report: PCT/IB 02/01082 (Jul. 8, 2002).
International Search Report: PCT/IB 02/01144 (Jul. 12, 2002).
International Search Report: PCT/IB 02/01026 (Jun. 28, 2002).
International Search Report: PCT/IB 02/01027 (Jun. 25, 2002).

Cuthbert, T., "Broadband Impedance Matching -Fast and Simple", RF Design, Cardiff Publishing Co., vol. 17, No. 12, Nov. 1994, pp. 38, 42, 44, 48, XP000477834.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Gevorgian, Spartak S. et al., "HTS/Ferroelectric Devices for Microwave Applications", IEEE Transactions on Applied Superconductivity, Jun. 1997, pp. 2458-2461, IEEE, USA.

Keis, V. N. et al., "20GHz tunable filter based on ferroelectric (BaSr) TiO3 film varactors", Electronics Letters, May 28, 1998, vol. 34, No. 11, IEE Stevenage, GB.

Kotzebue, K.L., "Broadband Electronically-Tunable Microwave Filters," 1960 IRE Wescon Convention Record, Part 1, pp. 21-27.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Toncich et al., "Data Reduction Method for Q Measurements of Stripline Resonators", IEEE Transactions in MTT, vol. 40, No. 9, Sep. 1992, pp. 1833-1836.

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

International Search Report: PCT/US2005/026001 (Nov. 3, 2005).

* cited by examiner

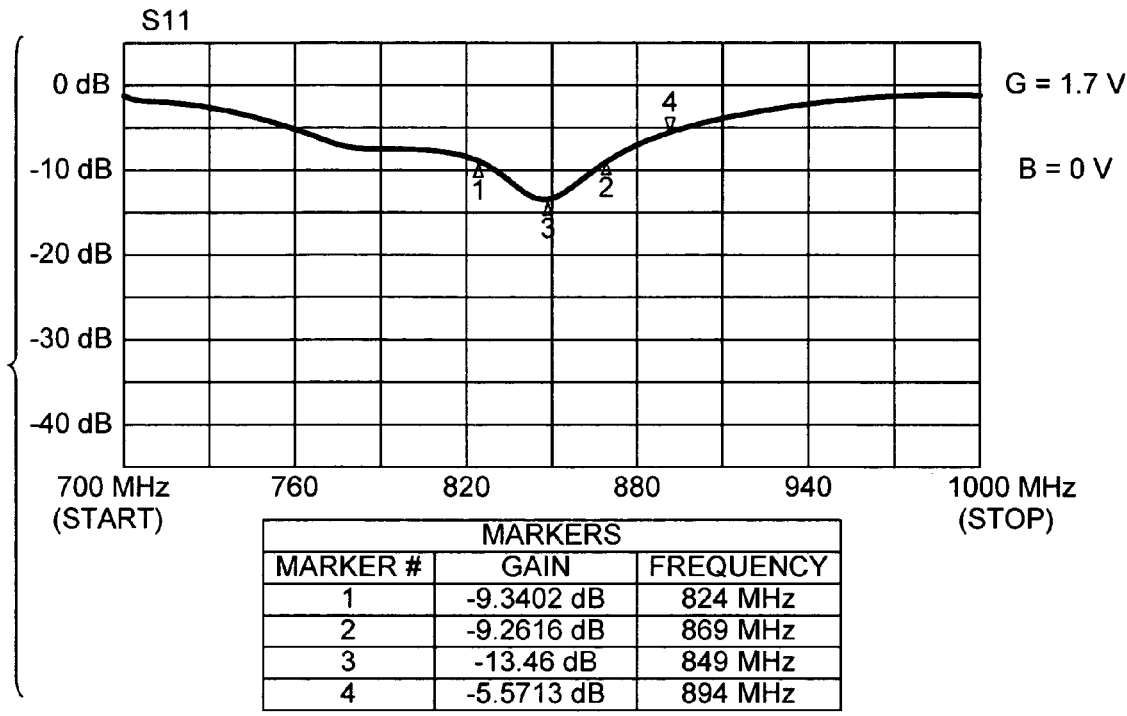
FIG. 12 (TUNABLE ANTENNA MATCHING NETWORK FIRST PROTOTYPE OPTIMIZATION FOR LOW CHANNEL: TX=824 MHz, RX=869 MHz)
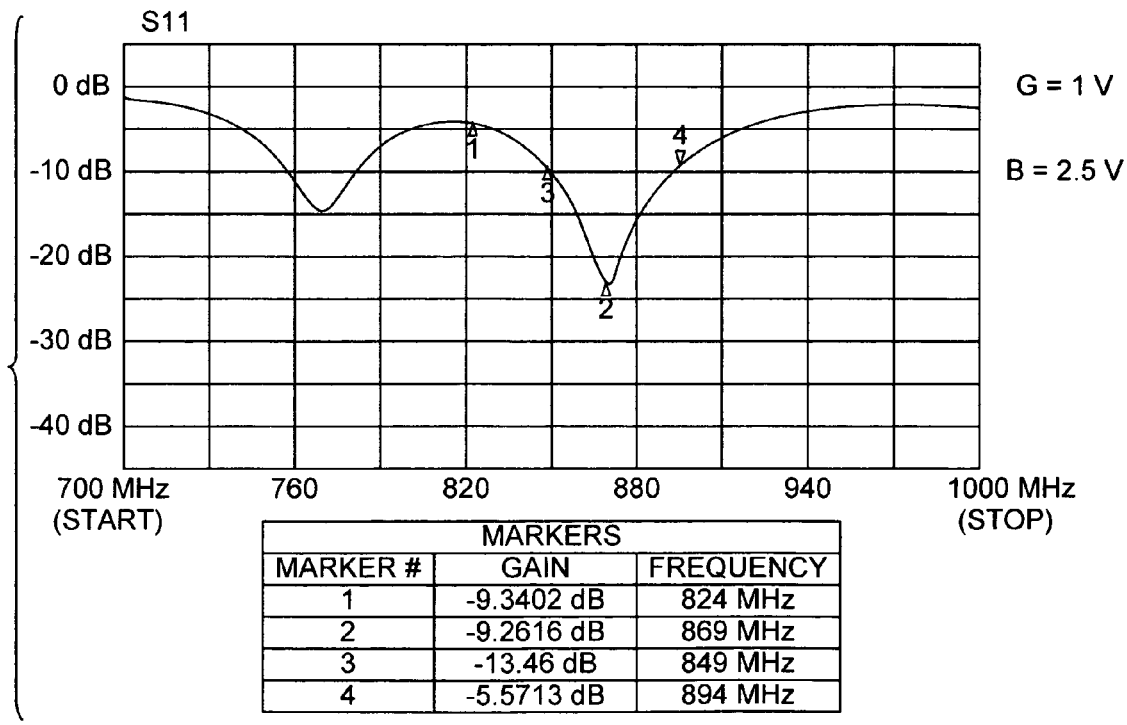
FIG. 13 (TUNABLE ANTENNA MATCHING NETWORK FIRST PROTOTYPE OPTIMIZATION FOR HIGH CHANNEL: TX=849 MHz, RX=894 MHz)

Fig. 14
INTERNAL ANTENNA MEASURED S11
CELLULAR BAND
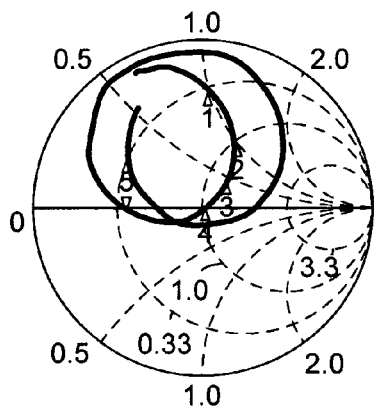
| MARKERS | | |
|---|---|---|
| # | R | X | FREQUENCY |
| 1 | 22.895 Ω | 49.814 Ω | 824 MHz |
| 2 | 51.936 Ω | 47.877 Ω | 849 MHz |
| 3 | 63.488 Ω | 25.379 Ω | 859 MHz |
| 4 | 53.309 Ω | 1.9629 Ω | 869 MHz |
| 5 | 18.141 Ω | -733.4 mΩ | 894 MHz |
PCS BAND
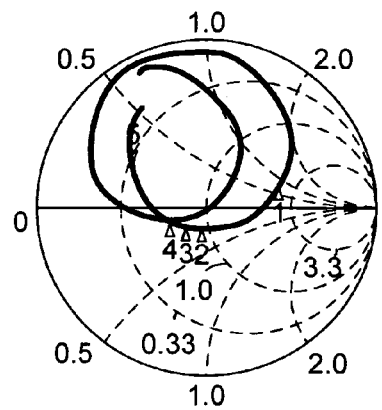
| MARKERS | | |
|---|---|---|
| # | R | X | FREQUENCY |
| 1 | 117 Ω | 39.008 Ω | 1.85 GHz |
| 2 | 46.324 Ω | -11.563 Ω | 1.91 GHz |
| 3 | 38.457 Ω | -8.8203 Ω | 1.92 GHz |
| 4 | 32.871 Ω | -5.4297 Ω | 1.93 GHz |
| 5 | 17.845 Ω | 10.313 Ω | 1.99 GHz |
R = RESISTANCE
X = REACTANCE
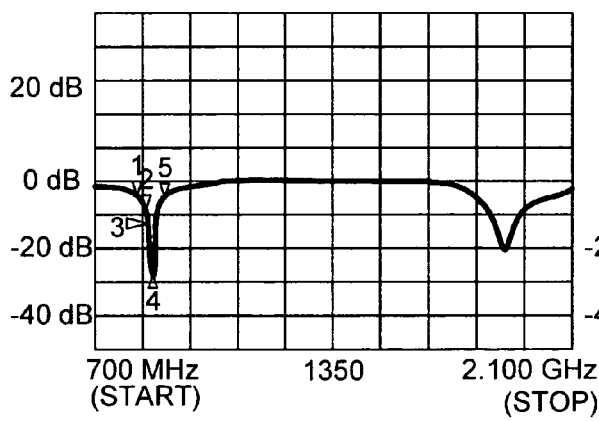
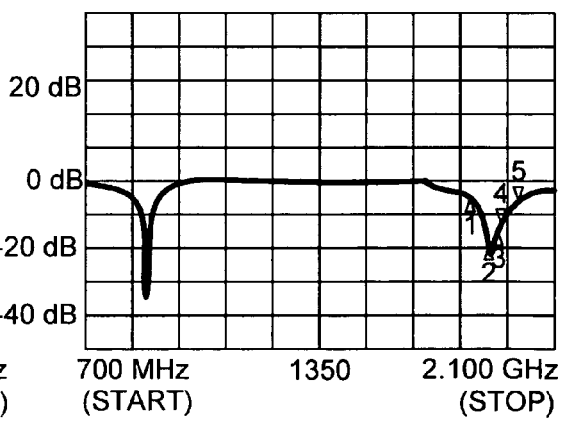
| MARKERS | |
|---|---|
| # | GAIN | FREQUENCY |
| 1 | -3.844 dB | 824 MHz |
| 2 | -7.431 dB | 849 MHz |
| 3 | -12.225 dB | 859 MHz |
| 4 | -27.113 dB | 869 MHz |
| 5 | -6.608 dB | 894 MHz |
| MARKERS | |
|---|---|
| # | GAIN | FREQUENCY |
| 1 | -6.896 dB | 1.85 GHz |
| 2 | -18.007 dB | 1.91 GHz |
| 3 | -15.714 dB | 1.92 GHz |
| 4 | -13.299 dB | 1.93 GHz |
| 5 | -6.159 dB | 1.99 GHz |

CELLULAR BAND LOW BAND EDGE OPTIMIZATION
CELL BAND TUNING

L1 = 8 nH
L2 = 2 nH
C1 = 2.35 pF
C2 = 2.9 pF

| MARKERS | | | |
|---|---|---|---|
| # | R | X | FREQUENCY |
| 1 | 2.077 | 2.077 | 824 MHz |
| 2 | 1.787 | 1.787 | 849 MHz |
| 3 | 1.77 | 1.77 | 859 MHz |
| 4 | 1.973 | 1.973 | 869 MHz |
| 5 | 3.456 | 3.456 | 894 MHz |

R = NORMALIZED RESISTANCE
X = NORMALIZED REACTANCE

CELLULAR BAND HIGH BAND EDGE OPTIMIZATION
CELL BAND TUNING

L1 = 8 nH
L2 = 2 nH
C1 = 2.6 pF
C2 = 2.6 pF

| MARKERS | | | |
|---|---|---|---|
| # | R | X | FREQUENCY |
| 1 | 3.24 | 3.24 | 824 MHz |
| 2 | 2.433 | 2.433 | 849 MHz |
| 3 | 1.96 | 1.96 | 859 MHz |
| 4 | 1.662 | 1.662 | 869 MHz |
| 5 | 2.453 | 2.453 | 894 MHz |

R = NORMALIZED RESISTANCE
X = NORMALIZED REACTANCE

PCS BAND LOW BAND EDGE OPTIMIZATION
CELL BAND TUNING

L1 = 8 nH
L2 = 2 nH
C1 = 3.1 pF
C2 = 1.85 pF

| MARKERS | | | |
|---|---|---|---|
| # | R | X | FREQUENCY |
| 1 | 2.137 | 2.137 | 1850 MHz |
| 2 | 1.744 | 1.744 | 1910 MHz |
| 3 | 1.87 | 1.87 | 1920 MHz |
| 4 | 2.003 | 2.003 | 1930 MHz |
| 5 | 3.009 | 3.009 | 1990 MHz |

R = NORMALIZED RESISTANCE
X = NORMALIZED REACTANCE

PCS BAND HIGH BAND EDGE OPTIMIZATION
CELL BAND TUNING

L1 = 8 nH
L2 = 2 nH
C1 = 2.6 pF
C2 = 3.5 pF

| MARKERS | | | |
|---|---|---|---|
| # | R | X | FREQUENCY |
| 1 | 3.211 | 3.211 | 1850 MHz |
| 2 | 1.76 | 1.76 | 1910 MHz |
| 3 | 1.66 | 1.66 | 1920 MHz |
| 4 | 1.599 | 1.599 | 1930 MHz |
| 5 | 2.115 | 2.115 | 1990 MHz |

R = NORMALIZED RESISTANCE
X = NORMALIZED REACTANCE

SYSTEM AND METHOD FOR IMPEDANCE MATCHING AN ANTENNA TO SUB-BANDS IN A COMMUNICATION BAND

RELATED APPLICATIONS

This application is related to and is a continuation-in-part of U.S. applications "FERROELECTRIC ANTENNA AND METHOD FOR TUNING SAME", Ser. No. 10/117,628, filed on Apr. 4, 2002 now U.S. Pat. No. 6,861,985; "INVERTED-F FERROELECTRIC ANTENNA", Ser. No. 10/120,603, filed on Apr. 9, 2002 now U.S. Pat. No. 6,885,341; and "TUNABLE ANTENNA MATCHING CIRCUIT", Ser. No. 10/075,896, filed on Feb. 12, 2002 now U.S. Pat. No. 6,765,540, all of which are incorporated herein by reference.

This application is related to U.S. APPLICATIONS "TUNABLE HORN ANTENNA", Ser. No. 10/122,399, filed on Apr. 12, 2002; "TUNABLE WAVEGUIDE ANTENNA", Ser. No. 10/122,968, filed on Apr. 11, 2002; "TUNABLE DIPOLE ANTENNA", Ser. No. 10/121,773, filed on Apr. 11, 2002; and "TUNABLE MATCHING CIRCUIT", Ser. No. 09/927,136, filed on Aug. 10, 2001, all of which are incorporated herein by reference.

This application is also related to the following two U.S. applications filed on the same day as the present application and having the same inventors, and which applications are incorporated herein by reference: "SYSTEM AND METHOD FOR DUAL-BAND ANTENNA MATCHING"; and "FULL-DUPLEX ANTENNA SYSTEM AND METHOD".

BACKGROUND OF THE INVENTION

1. Field of the Invention

This invention generally relates to wireless communication antennas and, more particularly, to a system and method for selectively matching an antenna to selected sub-bands in a communication band.

2. Description of the Related Art

The size of portable wireless communications devices, such as telephones, continues to shrink, even as more functionality is added. As a result, the designers must increase the performance of components or device subsystems and reduce their size, while packaging these components in inconvenient locations. One such critical component is the wireless communications antenna. This antenna may be connected to a telephone transceiver, for example, or a global positioning system (GPS) receiver.

State-of-the-art wireless telephones are expected to operate in a number of different communication bands. In the US, the cellular band (AMPS), at around 850 megahertz (MHz), and the PCS (Personal Communication System) band and DCS band, at around 1900 MHz, are used. Other communication bands include the PCN (Personal Communication Network) at approximately 1800 MHz, the GSM system (Groupe Speciale Mobile) at approximately 900 MHz and 1830 MHz, and the JDC (Japanese Digital Cellular) at approximately 800 and 1500 MHz. Other bands of interest are GPS signals at approximately 1575 MHz, Bluetooth at approximately 2400 MHz, and wideband code division multiple access (WCDMA) at approximately 1850 to 2200 MHz.

Wireless communications devices are known to use simple cylindrical coil or whip antennas as either the primary or secondary communication antennas. Inverted-F antennas are also popular. The resonance frequency of an antenna is responsive to its electrical length, which forms a portion of the operating frequency wavelength. The electrical length of a wireless device antenna is often a multiple of a quarter-wavelength, such as $5\lambda/4$, $3\lambda/4$, $\lambda/2$, or $\lambda/4$, where $\lambda$ is the wavelength of the operating frequency, and the effective wavelength is responsive to the physical length of the antenna radiator and the proximate dielectric constant.

Conventionally, each wireless device transceiver (receiver and/or transmitter) is connected to a discrete antenna that resonates in a particular communication band. While the antenna may resonant fairly well across an entire communication band, it cannot be optimally tuned for every channel in the communication band. Thus, the wide-band tuning comes at the expense of optimal efficiency.

Many state-of-the-art wireless devices operate in a number of communication bands. However, it is difficult to locate discrete antennas in a portable wireless device when the device incorporates a number of transceivers, each operating in a different communication band, or one transceiver that can be tuned to operate in a number of communications bands. A brute-force approach has been to add a different resonator or antenna for each communication band. For example, it is known to stack two microstrip patches with different areas to create non-harmonically related resonant frequency responses. Such a design may be inadequate to cover all the required frequencies (communication bands), however. One work-around solution for the above-mentioned antenna has been to widen the bandpass response of the higher communication band, to cover GPS and PCS communications for example, and to use the lower communication band to resonate at cellular band (AMPS) frequencies. However, the widening of the higher band, to improve GPS and PCS performance, comes at the expense of cellular band performance.

Conventional antenna designs incorporate the use of a dielectric material. Generally speaking, a portion of the field that is generated by the antenna returns to the counterpoise (ground), from the radiator, through the dielectric. The antenna is tuned to be resonant at frequencies, and the wavelength of the radiator and dielectric constant have an optimal relationship at the resonant frequency. The most common dielectric is air, with a dielectric constant of 1. The dielectric constants of other materials are defined with respect to air.

Ferroelectric materials have a dielectric constant that changes in response to an applied voltage. Because of their variable dielectric constant, ferroelectric materials are good candidates for making tunable components. Conventional measurement techniques, however, have characterized ferroelectric components as substantially lossy, regardless of the processing, doping or other fabrication techniques used to improve their loss properties. Ferroelectric tunable components operating in RF or microwave regions had been perceived as being particularly lossy. This observation is supported by experience in radar applications where, for example, high radio frequency (RF) or microwave loss is the conventional rule for bulk (thickness greater than about 1.0 mm) FE (ferroelectric) materials especially when maximum tuning is desired. In general, most FE materials are lossy unless steps are taken to improve (reduce) their loss. Such steps include, but are not limited to: (1) pre and post deposition annealing or both to compensate for $O_2$ vacancies, (2) use of buffer layers to reduce surfaces stresses, (3) alloying or buffering with other materials and (4) selective doping.

As demand for the limited range tuning of lower power components has increased in recent years, the interest in ferroelectric materials has turned to the use of thin film rather than bulk materials. The assumption of high ferroelectric loss, however, has carried over into thin film work as well. Conventional broadband measurement techniques have bolstered the assumption that tunable ferroelectric components, whether bulk or thin film, have substantial loss. In wireless communication matching circuits, for example, a Q of greater than 40, and preferably greater than 180 and, more preferably, greater than 350, is necessary at frequencies of about 2 GHz. These same assumptions apply to the design of antenna interface circuitry and transceivers.

Tunable ferroelectric components, especially those using thin films, can be employed in a wide variety of frequency agile circuits. Tunable components are desirable because they permit circuitry to be tuned to selectable channels or sub-bands in a communication band. A tunable component that covers multiple sub-bands potentially reduces the total number of components in a device, as discrete band fixed-frequency components and their associated switches become unnecessary. These advantages are particularly important in wireless handset design, where the need for increased functionality, and lower cost and size are seemingly contradictory requirements. With CDMA handsets, for example, the performance of individual components is highly stressed. FE materials may also permit integration of RF components that, to-date, have resisted shrinkage.

Tunable antenna designs have been disclosed in the Related Applications listed above, and optimal sub-band resonance is possible using an FE dielectric antenna. However, tunable antennas are relatively complex, and more expensive to build than conventional fixed-frequency antennas.

It would be advantageous if an antenna could be optimally matched for particular selected channels in a communication band.

It would be advantageous if the above-mentioned channel-matched antenna had a fixed impedance. That is, if the channel selectively could be performed using a non-tunable antenna.

It would be advantageous if the above-mentioned channel selectablity could be obtained by using an antenna matching circuit that is tunable.

SUMMARY OF THE INVENTION

The present invention describes an antenna matching system that can be tuned to provide an optimal matching impedance at selected channels, or sub-bands in a communication band. The optimal matching permits greater efficiency, a lower receiver noise floor, lower transmitter power, or optimal bandwidth, without the complication of a tunable antenna or a the larger form factor associated with the use of a plurality of selectable antennas, or a wide-band antenna. The present invention also permits an antenna match to be responsive to changes in loading caused by the interaction of a portable wireless device with a human body in close proximity.

Accordingly, a method is provided for sub-band impedance matching an antenna. The method comprises: accepting a frequency-dependent impedance from an antenna; and, selectively supplying a conjugate impedance match for the antenna at a sub-band of a first communication band. In some aspects, the method further comprises selectively supplying a conjugate impedance match for the antenna at a sub-band of a second communication band. That is, the antenna can be matched to specific channels in one of two separate communications bands.

More specifically, the method comprises: tuning a first tuning circuit to a first frequency; simultaneously tuning a second tuning circuit to a second frequency. Then, the antenna can be matched at a low end of the first communication band in response to the first and second frequencies. Likewise, if the first tuning circuit is tuned to a third frequency and the second tuning circuit is tuned to a fourth frequency, then the antenna can be matched at a high end of the first communication band in response to the third and fourth frequencies.

If the first tuning circuit is tuned to a fifth frequency and the second tuning circuit is tuned to a sixth frequency, the antenna is matched at a low end of the second communication band in response to the fifth and sixth frequencies. Likewise, if the first tuning circuit is tuned to a seventh frequency and the second tuning circuit is tuned to an eighth frequency, the antenna is matched at a high end of the second communication band in response to the seventh and eighth frequencies. In some aspects, the frequency tuning is accomplished using a ferroelectric (FE) material with a variable dielectric constant responsive to a control voltage.

Additional details of the above-described method, an antenna matching system for selectively matching a communications bandwidth segment impedance, and a wireless communications device with a bandwidth segment antenna matching system, are provided below.

BRIEF DESCRIPTION OF THE DRAWINGS

FIG. 12 is a plot depicting the return loss of an antenna and the matching circuit of FIG. 3b.

FIG. 13 is a plot depicting the return loss of an antenna and the matching circuit of FIG. 3b, as tuned to a high sub-band in the cell communication band.

FIG. 14 illustrates Smith chart and return loss magnitude plots of an exemplary antenna, at both the cell and PCS communication bands.

DETAILED DESCRIPTION OF THE PREFERRED EMBODIMENTS

Figure 1:
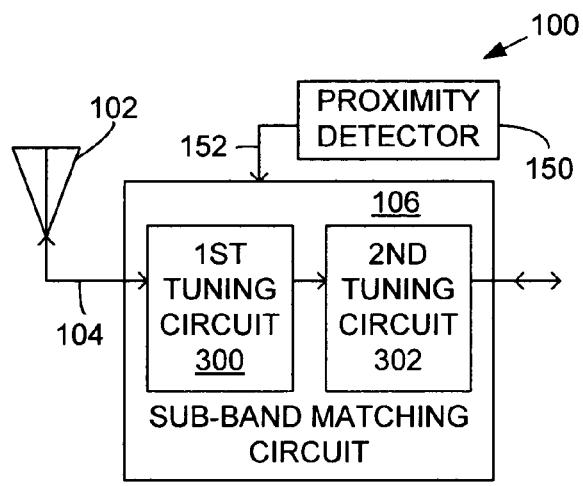
FIG. 1 is a schematic block diagram of the present invention antenna matching system for selectively matching a communication bandwidth segment impedance.

FIG. 1 is a schematic block diagram of the present invention antenna matching system for selectively matching a communication bandwidth segment impedance. The system 100 comprises an antenna 102 having an interface port on line 104 with a frequency-dependent impedance. A sub-band matching circuit 106 has an output port on line 104 connected to the antenna interface port. The sub-band matching circuit 106 selectively supplies a conjugate impedance at a sub-band of a first communication band. In its simplest form, the sub-band matching circuit 106 selectively supplies the conjugate impedance at a low end of the first communication band and at a high end of the first communication band.

It should be understood that an antenna will function to some extent, even if poorly matched. Some conventional antenna/matching circuit designs are able to cover an entire communication band by providing a widely varying match across the entire band. A poorly matched antenna is likely to result in inefficiencies as a result of power reflections at the matching circuit interface. The use of a poorly matched or inefficient antenna may result in a degraded receiver noise floor. Alternately, the use of a poorly matched or inefficient antenna may result in a lower power transmit signal, forcing the transmitter to compensate with the use of additional battery power.

It should be understood that the antenna 102 is unlikely to provide a constant impedance across all the frequencies of interest. Typically, an antenna has a complex impedance, a combination of resistance and reactance (imaginary impedance), and that the complex impedance will vary across the communications band. However, since the impedance of the antenna is fixed, the impedances in the various sub-bands in the communication band (frequency bands) can be determined. The sub-band matching circuit 106 is able to supply a conjugate impedance for each of the antenna complex impedances. Alternately stated, the sub-band matching circuit 106 is likely to supply a different conjugate match (complex impedance) for each sub-band.

A conjugate impedance is understood to have the same real value, and opposite imaginary value, of the impedance to which it is matched. For example, for an antenna impedance value of (25+13j) ohms in the center of the first communication band, the conjugate impedance is (25−13j) ohms. A perfect conjugate match is rare, expect at specific frequencies. Therefore, a conjugate match is typically optimizing for the center of a sub-band, and/or efforts are made to have the sub-band matching circuit impedance track the antenna impedance across a sub-band. While it is theoretically possible to build a matching circuit to provide a conjugate match to any impedance, it should be understood that the antenna may incorporate some fixed-tuning elements or structures that provide convenient (easy to match) impedances across the entire communication band.

In some aspects of the system 100, the sub-band matching circuit 106 supplies a conjugate impedance at a sub-band of a second communication band. In its simplest form, the sub-band matching circuit 106 selectively supplies the conjugate impedance at a low end of the second communication band and at a high end of the second communication band. It should be understood that the matching circuit need not necessarily simultaneously supply a conjugate match in the first and second communications bands. That is, the matching circuit may be operated to selectively supply a conjugate match in either the first or the second communication band.

Figure 2:
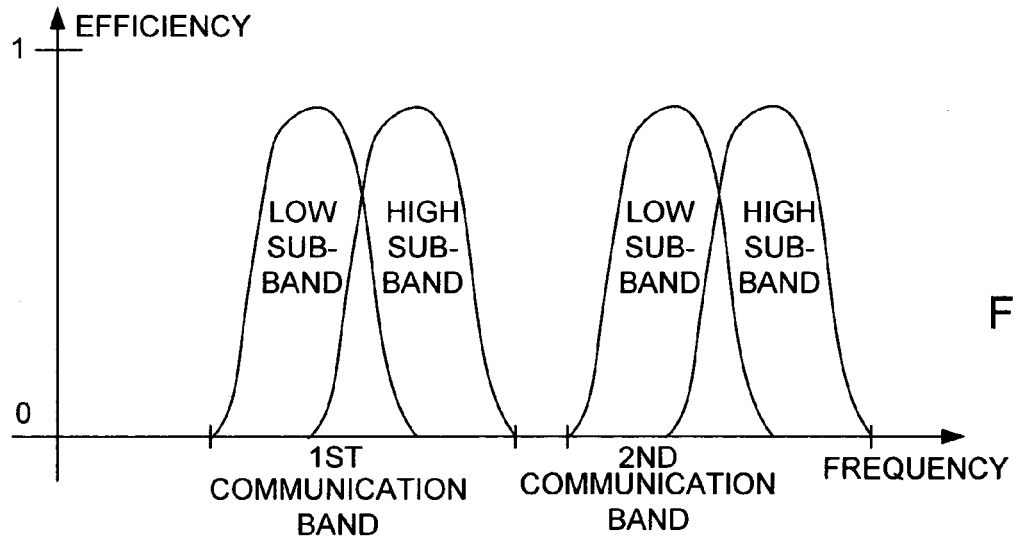
FIG. 2 is a graph illustrating the selection of sub-band antenna matches.

FIG. 2 is a graph illustrating the selection of sub-band antenna matches. Shown are a first and second communication band. Also shown are four different sub-bands, two sub-bands in the first communication band and two sub-bands in the second communication band. Although a frequency span is shown separating the two communications bands, in other aspects the communication bands are adjacent or overlapping. Likewise, the sub-bands may be separated by a frequency span, adjacent, or overlapping. Although only two communication bands are shown, it should be understood that the system can be extended to antenna-match sub-bands in three or more communications bands. Further, although only two sub-bands are shown for each communication band, in other aspects of the system, each communication band may be segmented by more than two sub-bands. That is, the sub-band matching circuit may supply the conjugate impedance at a plurality of sub-bands in the first communication band and/or at a plurality of sub-bands in the second communication band. It should be understood that the present invention matching system may be used for compensation, as well as channel selection. For example, the system may be used to compensate for the detuning effects of a human body, or other object, in close proximity to an antenna.

Figure 3A:
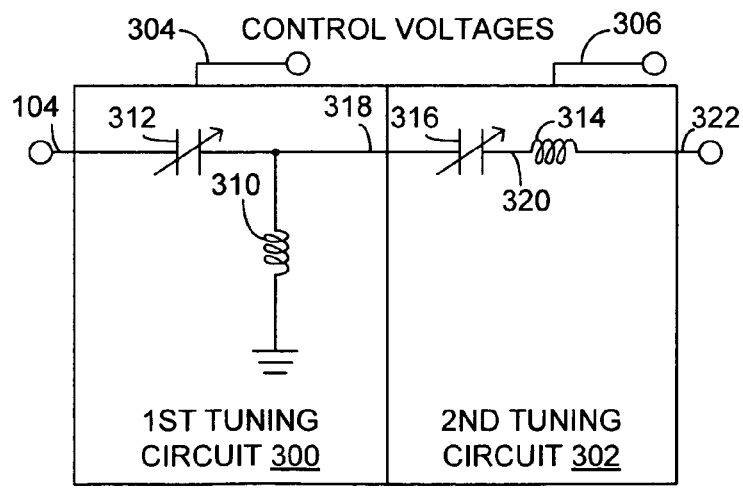
FIGS. 3a and 3b are schematic block diagrams depicting the sub-band matching circuit of FIG. 1 in greater detail.
Figure 3B:
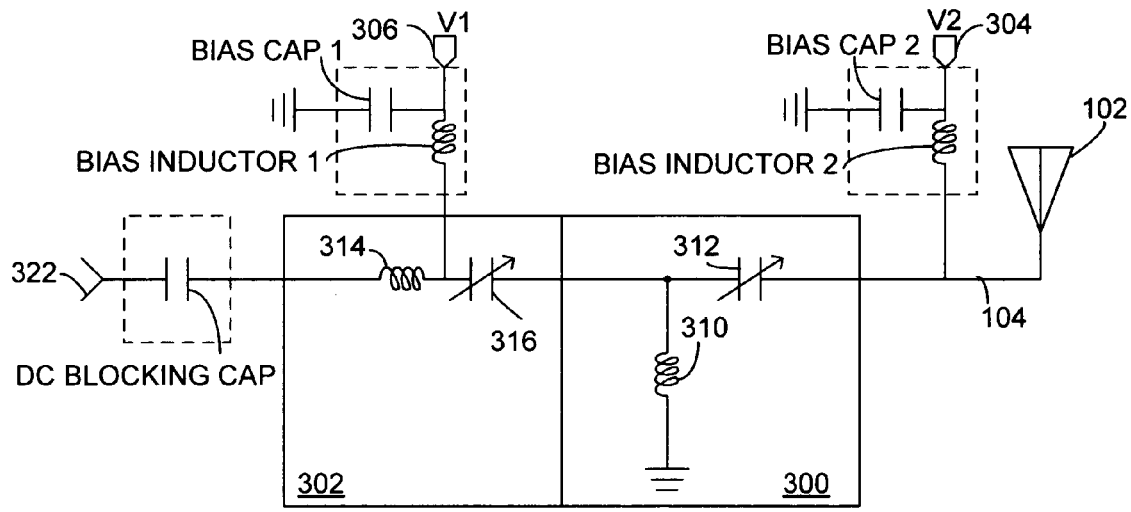

FIGS. 3a and 3b are schematic block diagrams depicting the sub-band matching circuit 106 of FIG. 1 in greater detail. In FIG. 3a, the sub-band matching circuit 106 includes a first tuning circuit 300 and a second tuning circuit 302. The sub-band matching circuit 106 selectively supplies the conjugate impedance at a low end of the first communication band in response to tuning the first tuning circuit 300 to a first frequency and tuning the second tuning circuit 302 to a second frequency. The conjugate impedance at a high end of the first communication band is supplied in response to tuning the first tuning circuit 300 to a third frequency and tuning the second tuning circuit 302 to a fourth frequency. Although the first and second tuning circuits 300/302 are shown as connected in series, parallel tuning topologies are also well known in the art. Although not shown, in some designs a blocking capacitor may be inserted in the transmission line 104, between the antenna 102 and the sub-band matching circuit 106.

In the event that the system also tunes the antenna in the second communication band, the conjugate impedance at a low end of the second communication band is supplied in response to tuning the first tuning circuit 300 to a fifth frequency and tuning the second tuning circuit 302 to a sixth frequency. Likewise, the conjugate impedance at a high end of the second communication band is supplied in response to tuning the first tuning circuit 300 to a seventh frequency and tuning the second tuning circuit 308 to an eighth frequency.

In some aspects, the first and second tuning circuits 300/302 each include a ferroelectric (FE) dielectric material having a variable dielectric constant responsive to a control voltage and an interface, on lines 304 and 306, respectively, to receive the control voltage. In one aspect, there is a linear relationship between the tuning voltage and the dielectric constant. In another aspect, the relationship is at least more linear than the voltage/capacitance curve of a voractor diode, especially in the tuning range between 0 and 3 volts. The FE material can be a dielectric material in a tunable capacitor, or a dielectric material proximate to either a discrete or microstrip inductor, to name a few examples. The first and second tuning circuits 300/302 are preferably responsive to control voltages in the range of zero to three volts dc. This voltage range can be supported by a conventional wireless device battery. There are many well-known variable or tunable components that do not use FE materials. However, FE is a good choice of material for use in portable wireless devices where size and performance (high Q) are important.

In the simplest form, the dual-band matching circuit of the present invention may be enabled using a tunable series element or a tunable shunt element, such as a capacitor or inductor. Alternately, the dual-band matching circuit any be an "L", π, "T", or combinations of the above-mentioned topologies. The dual-band matching circuit is not limited to any particular topology.

An exemplary first tuning circuit 300 includes a first inductor 310 with a fixed inductance value and a first variable capacitor 312 with a selectable capacitance value. The second tuning circuit 302 includes a second inductor 314 with a fixed inductance value and a second variable capacitor 316 with a selectable capacitance value.

The first variable capacitor 312 has a first terminal connected to the sub-band matching circuit output port on line 104. The first inductor 310 is connected in shunt between a second terminal of the first variable capacitor on line 318 and a reference voltage. For example, the reference voltage can be ground. The second variable capacitor 316 has a first terminal connected to the first variable capacitor second terminal on line 318. The second inductor 314 is connected in series between a second terminal of the second variable capacitor on line 320 and a sub-band matching circuit input port on line 322.

To continue the example, the first inductor 310 has an inductance of 8 nano-Henrys (nH) and the first variable capacitor 312 has a capacitance in the range between 2.35 and 3.1 picofarads (pF). The second inductor 314 has an inductance of 2 nH and the second variable capacitor 316 has a capacitance in the range between 1.85 and 3.5 pF.

The first tuning circuit 310 first frequency is responsive to a first variable capacitor value of 2.35 pF, and the second tuning circuit 312 second frequency is responsive to a second variable capacitor value of 2.9 pF. These are the values used to create the low sub-band match in the first communication band. The first tuning circuit 310 third frequency is responsive to a first variable capacitor value of 2.6 pF, and the second tuning circuit 312 fourth frequency is responsive to a second capacitor value of 2.6 pF. These are the values used to create the high sub-band match in the first communication band.

The first tuning circuit 310 fifth frequency is responsive to a first variable capacitor value of 3.1 pF, and the second tuning circuit 312 sixth frequency is responsive to a second capacitor value of 1.85 pF. These are the values used to create the low sub-band match in the second communication band. The first tuning circuit 310 seventh frequency is responsive to a first variable capacitor value of 2.6 pF, and the second tuning circuit 312 eighth frequency is responsive to a second capacitor value of 3.5 pF. These are the values used to create the high sub-band match in the second communication band. It should be understood that additional sub-band positions in the communication band may be generated by using "in-between" capacitor values. For example, a mid-sub-band position for the first communication band can be generated in response to tuning the first variable capacitor value of approximately 2.5 pf and the second variable capacitor 316 to approximately 2.75 pf.

It should be understood that the invention may be enabled with other components and circuit topologies than the ones shown in FIG. 3a. Further, additional components, with either fixed or variable values, can be added to increase the number of poles, giving the circuits greater tunability and/or a sharper frequency response.

Using the above-mentioned values to extend the example still further, the sub-band matching circuit 106 supplies the conjugate impedance at a first communication band in the range between 824 and 894 megahertz (MHz) and at a second communication band in the range of 1850 and 1990 MHz. With respect to a wireless telephone device, other communication bands of interest include GPS, WCDMS, JDC, PCN, GMS, and Bluetooth.

FIG. 3b shows the sub-band matching circuit of FIG. 3a, specifically enabled with FE capacitors.

FIG. 14 illustrates Smith chart and return loss magnitude plots of an exemplary antenna, at both the cell and PCS communication bands.

FIG. 12 is a plot depicting the return loss of an antenna and the matching circuit of FIG. 3b. As shown, the matching circuit supplies a conjugate impedance for a low sub-band in the cell communication band, in response to supplying a voltage of 1.7 volts to the first capacitor and 0 volts to the second capacitor.

FIG. 13 is a plot depicting the return loss of an antenna and the matching circuit of FIG. 3b, as tuned to a high sub-band in the cell communication band. A voltage of 1 volt is supplied to the first capacitor and a voltage of 2.5 volts is supplied to the second capacitor.

Figure 15:
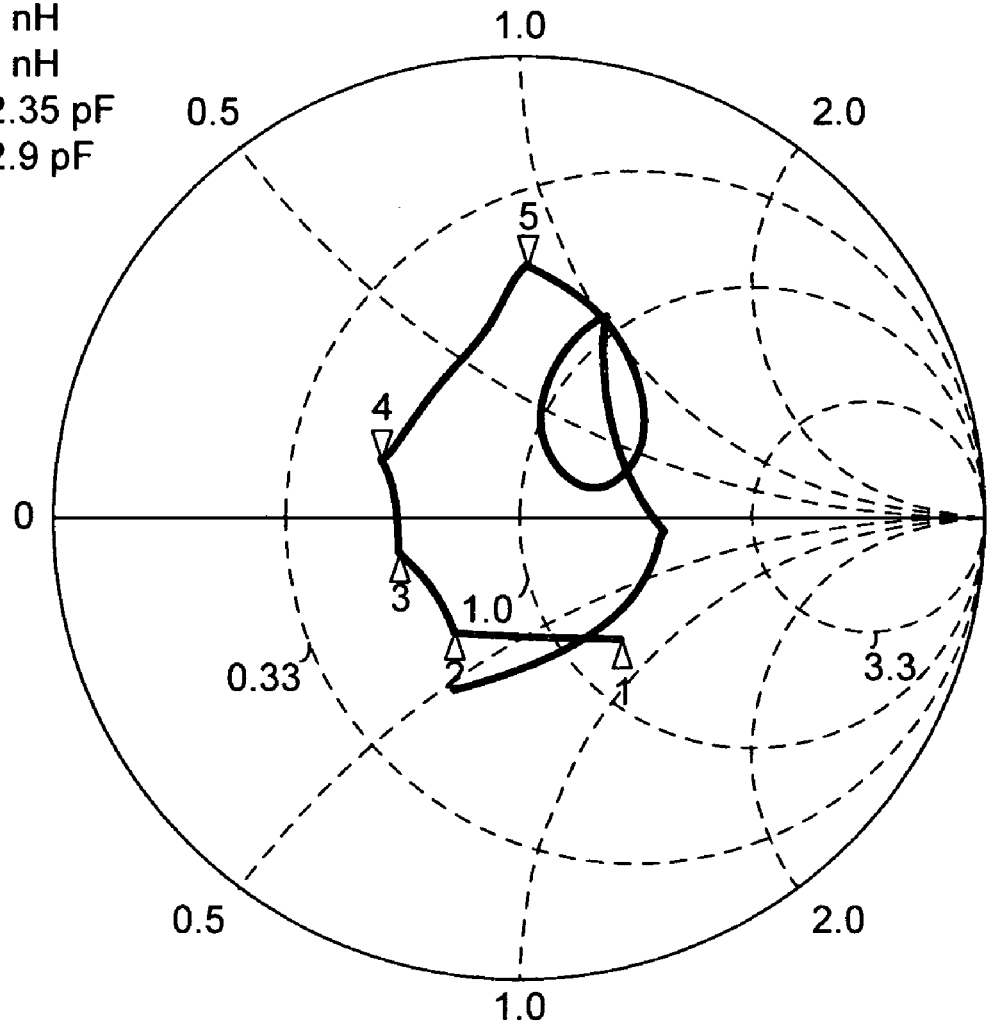
FIG. 15 is a Smith chart illustrating the return loss of the antenna of FIG. 14 and the matching circuit of FIG. 3b, at a low sub-band of the cell communication band.

FIG. 15 is a Smith chart illustrating the return loss of the antenna of FIG. 14 and the matching circuit of FIG. 3b, at a low sub-band of the cell communication band. The first and second capacitors are tuned to 2.35 and 2.9 pf, respectively.

Figure 16:
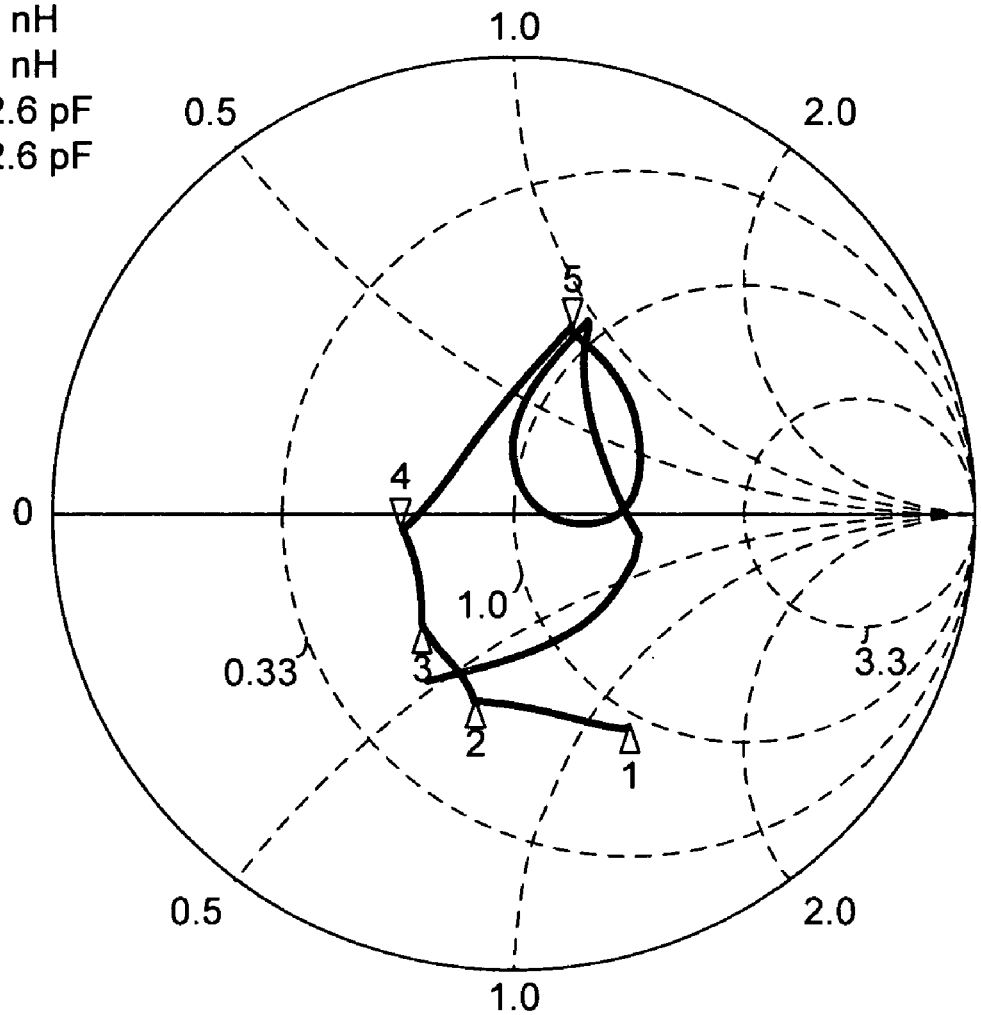
FIG. 16 is a Smith chart illustrating the return loss of the antenna of FIG. 14 and the matching circuit of FIG. 3b, at a high sub-band of the cell communication band.

FIG. 16 is a Smith chart illustrating the return loss of the antenna of FIG. 14 and the matching circuit of FIG. 3b, at a high sub-band of the cell communication band. The first and second capacitors are both tuned to 2.6 pf.

Figure 17:
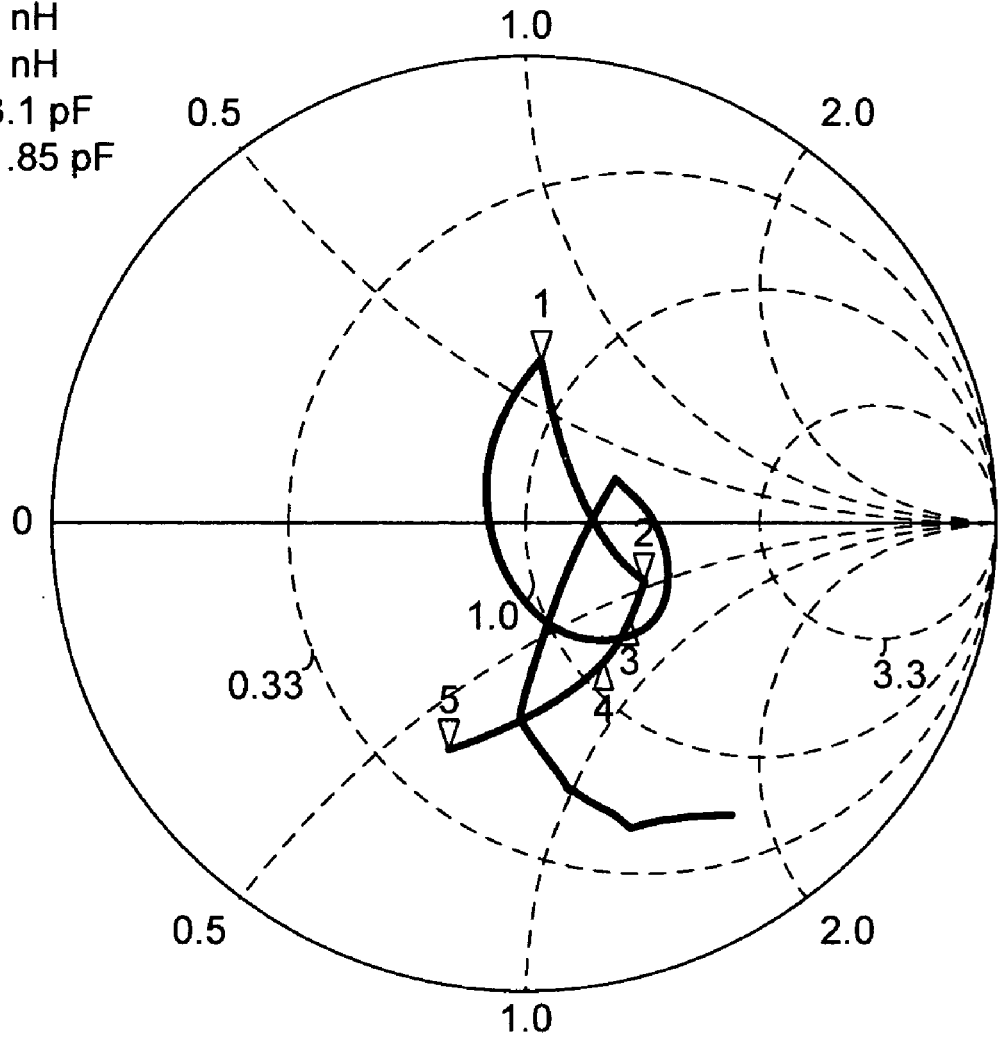
FIG. 17 is a Smith chart illustrating the return loss of the antenna of FIG. 14 and the matching circuit of FIG. 3b, at a low sub-band of the PCS communication band.

FIG. 17 is a Smith chart illustrating the return loss of the antenna of FIG. 14 and the matching circuit of FIG. 3b, at a low sub-band of the PCS communication band. The first and second capacitors are tuned to 3.1 and 1.85 pf, respectively.

Figure 18:
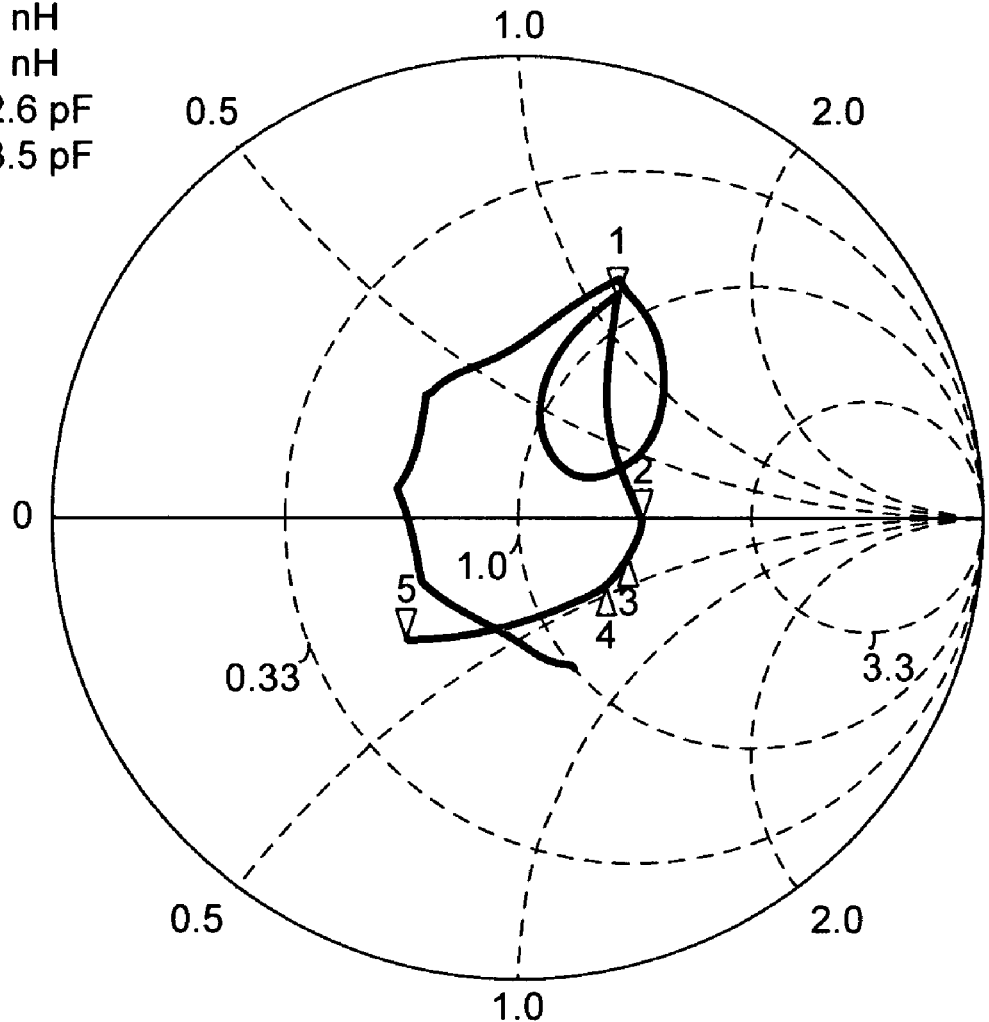
FIG. 18 is a Smith chart illustrating the return loss of the antenna of FIG. 14 and the matching circuit of FIG. 3b, at a high sub-band of the PCS communication band.

FIG. 18 is a Smith chart illustrating the return loss of the antenna of FIG. 14 and the matching circuit of FIG. 3b, at a high sub-band of the PCS communication band. The first and second capacitors are tuned to 2.35 and 2.9 pf, respectively.

Returning to FIGS. 3a and 3b, in some aspects the sub-band matching circuit 106 supplies the conjugate impedance with a return loss, or voltage standing wave ratio, or less than 2:1, at a first communication band sub-band of approximately 45 megahertz (MHz) and at a second communication band sub-band of approximately 80 MHz.

Other communication bands, bandwidths, and bandwidth spacings may be obtained by selecting different component values in the first and second tuning circuits. Further, it would be possible to modify the matching circuit concept developed above to create a matching circuit that is able to tune sub-bands of a multi-band antenna (i.e., a tri-band antenna). Although the exemplary tuning circuits may be enabled with FE capacitors, it is possible to build the circuits with conventional variable components, or a combination of FE and conventional variable components. As noted above, other well-known tuning topologies can be adapted for use in the present invention.

Generally, matching circuits can be implemented using lumped elements, distributed network elements, or some combination of the two. With distributed element matching, thin or thick FE films can be used in planar (microstrip, stripline, coplanar waveguide, among others) passive matching circuits to vary the permittivity of the underlying substrate, thus effecting a change in the matching circuit's or resonator's electrical length or characteristic impedance. The use of planar matching circuits is familiar to anyone trained in the art of amplifier or circuit design. The matching networks here can be hybrids and couplers as well as the more conventional distributed inductive and capacitive structures. If lumped element matching components are used, then FE based tunable capacitors can be used in a similar manner to effect change.

Figure 4:
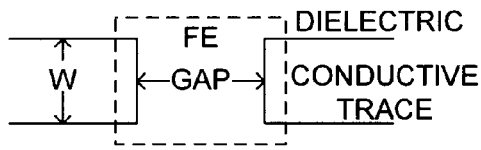
FIG. 4 is a plan view of a distributed element gap capacitor.

FIG. 4 is a plan view of a distributed element gap capacitor. Compared to an IDC, the gap capacitor has a better Q, but lower capacitance per unit cross section (W). The IDC's capacitance is greater due to the use of a number of fingers per unit cross section. For many communication filter applications, however, large capacitance (C>4.0 pF) is not needed. Thus, a gap capacitor often can provide adequate capacitance. The inherently high value of K for most FE films helps provide relatively high capacitance per unit cross-section, W, compared to a conventional gap capacitor.

Figure 5:
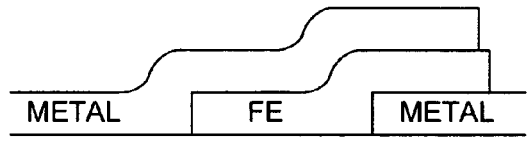
FIG. 5 is a cross-sectional view of an overlay capacitor.

FIG. 5 is a cross-sectional view of an overlay capacitor. In comparison to gap and interdigital capacitors, an overlay capacitor has the lowest $L_{geom}$. An overlay capacitor is an example of a parallel plate geometry where the plate dimensions (length and width) are much greater than the plate separation. Given such a geometry, most of the electric field between the plates is uniform except for fringing along the edges. The fringing effect can be reduced significantly by the use of a guard band, as is well known in the art. Thus, the geometric loss from a parallel plate capacitor is quite low. In addition, parallel plate geometries can provide high capacitances along with high tuning from small control voltage swings.

Figure 6:
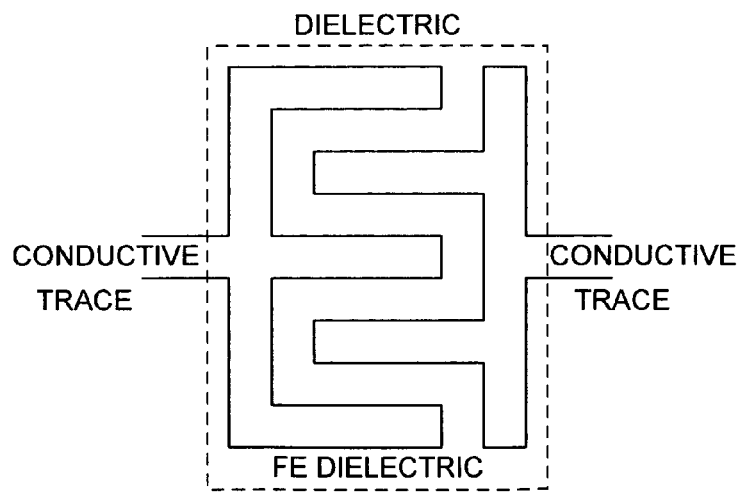
FIG. 6 is a plan view of an interdigital (IDC) capacitor.

FIG. 6 is a plan view of an interdigital (IDC) capacitor. For a given cross-sectional area, an IDC can provide a higher capacitance than a gap capacitor. Loss increases as the gap spacing decreases. Similarly, loss increases as finger width decreases. The finger length also affects loss with loss increasing as finger length increases; especially in a microstrip realization of an IDC as the odd mode loss dominates in such a structure. In addition, loss increases as the number of fingers increases, due to loss introduced from the additional sharp corners. Note that an increase in the number of fingers typically increases the capacitance of an IDC.

Figure 7:
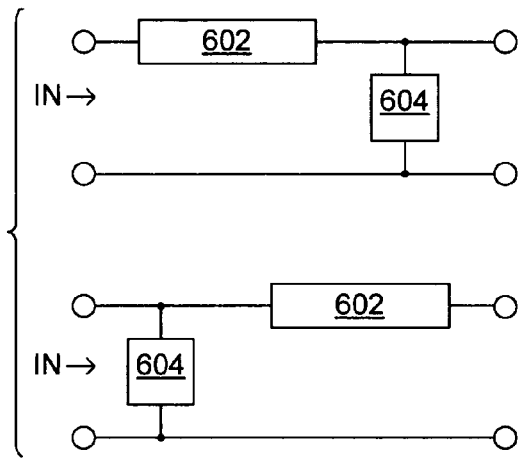
FIG. 7 is a schematic diagram depicting two possible "L" matching circuit configurations.

FIG. 7 is a schematic diagram depicting two possible "L" matching circuit configurations. The two reactive elements 602 and 604 may be any combination of capacitors and/or inductors.

Figure 8:
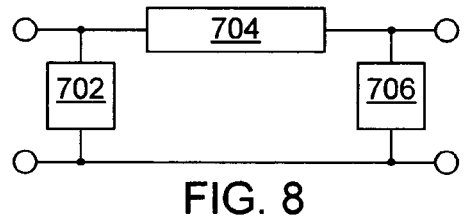
FIG. 8 is a schematic diagram depicting a $\pi$ matching network.

FIG. 8 is a schematic diagram depicting a π matching network. Again, the reactive elements 702, 704, and 706 may be any combination of capacitors and/or inductors.

Figure 9:
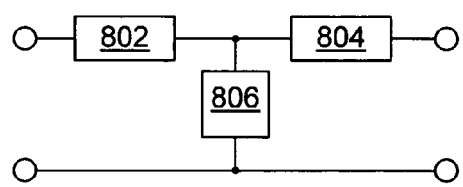
FIG. 9 is a schematic diagram depicting a "T" matching network.

FIG. 9 is a schematic diagram depicting a "T" matching network. Again, the reactive elements 802, 804, and 806 may be any combination of capacitors and/or inductors.

Figure 10:
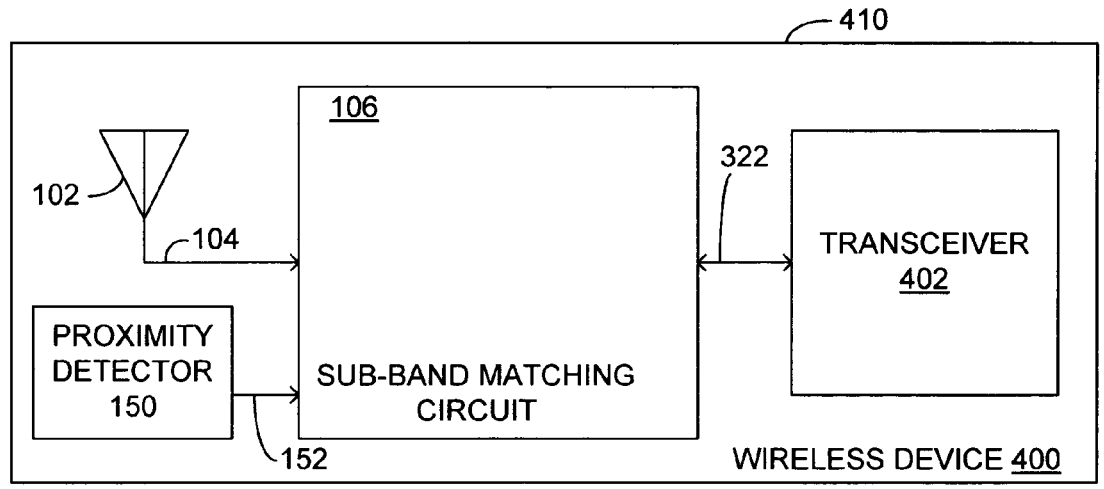
FIG. 10 is a schematic block diagram of the present invention wireless communications device with a bandwidth segment antenna matching system.

FIG. 10 is a schematic block diagram of the present invention wireless communications device with a bandwidth segment antenna matching system. The device 400 comprises a transceiver 402 having a wireless communications port on line 322 to communicate information in at least a first communication band. An antenna 102 has an interface port on line 104 with a frequency-dependent impedance. A sub-band matching circuit 106 includes an input port connected to the transceiver wireless communications port on line 322 and an output port connected to the antenna interface port on line 104. The sub-band matching circuit 106 selectively supplies a conjugate impedance at a sub-band of at least the first communication band.

As explained above, the sub-band matching circuit 106, in its simplest form, may selectively supply the conjugate impedance at a low end of the first communication band and at a high end of the first communication band. If the transceiver 402 communicates information in a second communication band, then the sub-band matching circuit 106 supplies a conjugate impedance at a sub-band of a second communication band. Again, the sub-band matching circuit 106, in its simplest form, selectively supplies the conjugate impedance at a low end of the second communication band and at a high end of the second communication band.

In one aspect of the invention, the first communication band is a transmission bandwidth, while the second communication bands is a receive bandwidth. In this aspect, the transceiver 402 incorporates transmit and receive functions. In another aspect, all communication bands are either receiver or transmission bandwidths. The communication bands may support telephone, Bluetooth, GPS, and radio communications. Typically, the transceiver 402 is selectively tuned to relatively narrow channels. Each communication band includes a plurality of frequency-consecutive channels. As noted above, in its simplest form the sub-band matching circuit 106 provides either a high-band or low-band match, in which case the sub-band covers a plurality of frequency-consecutive channels. In other aspects, the sub-band has a narrower frequency resolution. That is, the sub-band matching circuit 106 provides an optimal match that is centered on a selected channel, to provide even better matches at the expense of complexity (more tuning combinations).

As explained above, the sub-band matching circuit can be enabled with first tuning circuit and second tuning circuit, as shown in FIGS. 3a and 3b. Also as explained above, the first communication band may be in the range between 824 and 894 megahertz (MHz) and at the second communication band in the range of 1850 and 1990 MHz. The antenna 102 may also be matched for use in GSM, WCMA, Bluetooth, GPS, PCN, JDC, and radio communication bands.

Using the Cellular and PCS communication bands as an example, the sub-band matching circuit 106 may supply the conjugate impedance with a return loss of less than 2:1, at a first communication band sub-band of approximately 45 megahertz (MHz), and at a second communication band sub-band of approximately 80 MHz. However, other sub-band bandwidths are also possible. In some aspects the sub-band bandwidth is narrower in response to an increased number of sub-band matches per communication band. That is, the sub-band matching circuit 106 may supply the conjugate impedance at a plurality of sub-bands in the first communication band and/or at a plurality of sub-bands in the second communication band.

Figure 11:
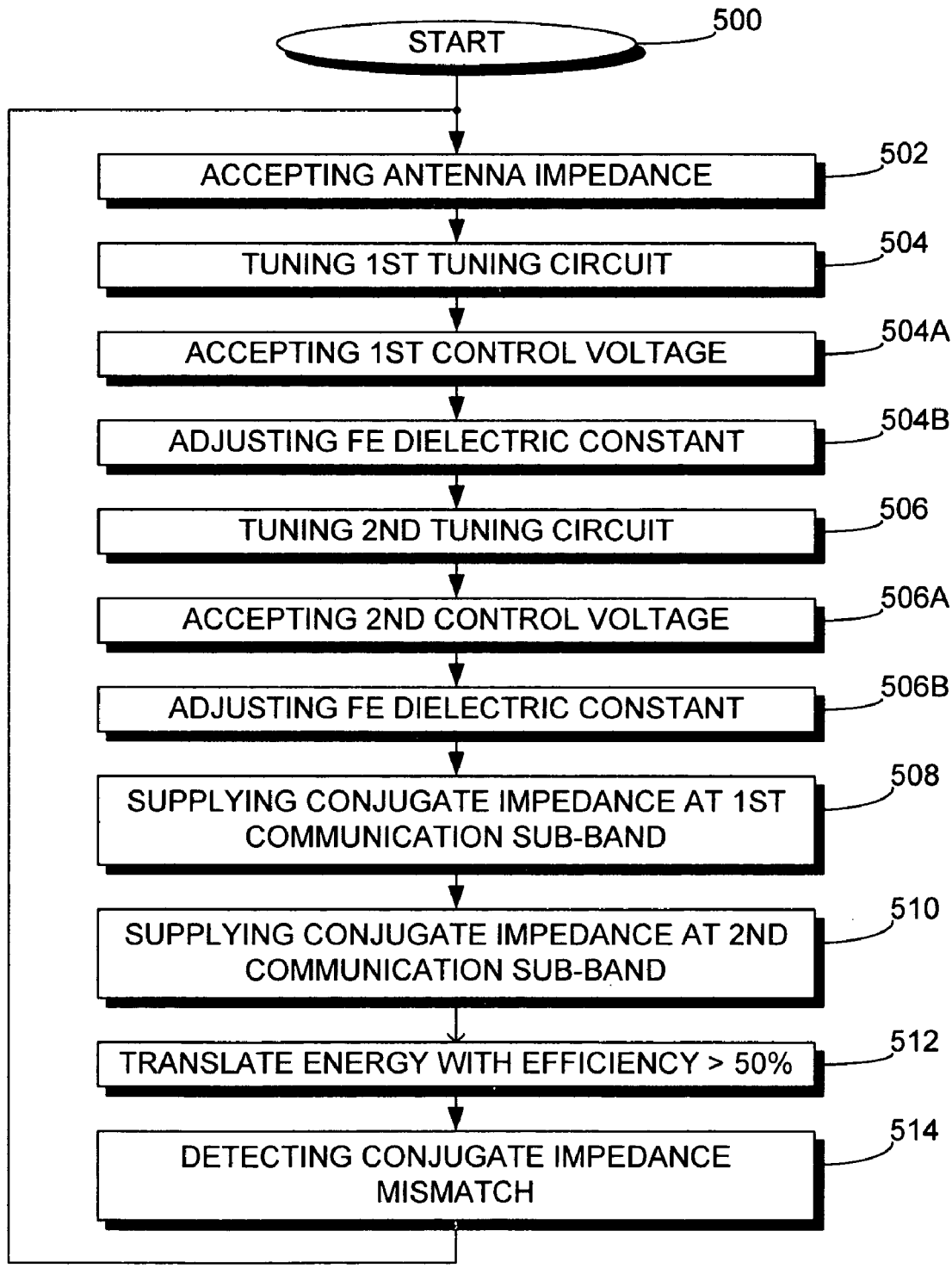
FIG. 11 is flowchart illustrating the present invention method for sub-band impedance matching an antenna.

FIG. 11 is flowchart illustrating the present invention method for sub-band impedance matching an antenna. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 accepts a frequency-dependent impedance from an antenna. Step 504 tunes a first tuning circuit. Step 506 simultaneously tunes a second tuning circuit. Step 508 selectively supplies a conjugate impedance match for the antenna at a sub-band of a first communication band. In some aspects the method includes a further step, Step 510 selectively supplies a conjugate impedance match for the antenna at a sub-band of a second communication band.

When Step 504 tunes the first tuning circuit to a first frequency and Step 506 tunes the second tuning circuit to a second frequency, then Step 508 matches the antenna at a low end of the first communication band in response to the first and second frequencies. When Step 504 tunes the first tuning circuit to a third frequency and Step 506 tunes the second tuning circuit to a fourth frequency, Step 508 matches the antenna at a high end of the first communication band in response to the third and fourth frequencies. Note, Steps 508 and 510 need not necessarily be performed simultaneously.

When Step 504 tunes the first tuning circuit to a fifth frequency and Step 506 tunes the second tuning circuit to a sixth frequency, then Step 510 matches the antenna at a low end of the second communication band in response to the fifth and sixth frequencies. When Step 504 tunes the first tuning circuit to a seventh frequency and Step 506 tunes the second tuning circuit to an eighth frequency, Step 510 matches the antenna at a high end of the second communication band in response to the seventh and eighth frequencies.

In some aspects, tuning the first and second tuning circuits in Step 504 and 506 includes substeps. Step 504a accepts a first control voltage for the first tuning circuit and Step 506a accepts a second control voltage for the second tuning circuit. Step 504b and 506b adjust the dielectric constant of a ferroelectric (FE) dielectric material in response to the control voltages. In some aspects, Steps 504a and 504b accept control voltages in the range between zero and 3 volts dc. In one aspect, there is a linear relationship between the tuning voltage and the dielectric constant. In another aspect, the relationship is at least more linear than the voltage/capacitance curve of a voractor diode, especially in the tuning range between 0 and 3 volts.

In other aspects, Step 504 tunes a first variable capacitor, with a selectable capacitance value, connected to a first inductor with a fixed inductance value. Step 506 tunes a second variable capacitor, with a selectable capacitance value, connected to a second inductor with a fixed inductance value. Further, Step 504 may include tuning a first variable capacitor, with a selectable capacitance in the range between 2.35 and 3.1 picofarads (pF), connected to a first inductor with a fixed inductance value of 8 nano-Henrys (nH). Step 506 then tunes a second variable capacitor, with a selectable capacitance value in the range of 1.85 and 3.5 pF, connected to a second inductor with a fixed inductance value of 2 nH. As noted above, the variable capacitors may be FE capacitors.

More specifically, Step 504 tunes the first variable capacitor to the first frequency at a capacitor value of 2.35 pF, the third frequency at a capacitor value of 2.6 pF, the fifth frequency at a capacitor value of 3.1 pF, and the seventh frequency at a capacitor value of 2.6 pF. Step 506 tunes the second variable capacitor to the second frequency at a capacitor value of 2.9 pF, the fourth frequency at a capacitor value of 2.6 pF, the sixth frequency at a capacitor value of 1.85 pF, and the eighth frequency at a capacitor value of 3.5 pF.

Then, Step 508 matches the antenna for a first communication band in the range of 824 to 894 MHz, and Step 510 matches the antenna for a second communication band in the range of 1850 to 1990 MHz. In some aspects, Step 508 matches the antenna with a return loss of less than 2:1 across a sub-band of approximately 45 MHz, and Step 510 matches the antenna with a return loss of less than 2:1 across a sub-band of approximately 80 MHz. The exemplary circuit design, or a different tuning circuit design can be used to create different sub-band bandwidths, sub-band frequency separations, and efficiencies.

As noted above, it is possible to tune the capacitors to in-between values to create in-between sub-band matches. That is, selectively supplying a conjugate impedance match for the antenna at a sub-band of a first communication band in Step 508 includes matching the antenna at a plurality of sub-bands in the first communication band. Likewise, selectively supplying a conjugate impedance match for the antenna at a sub-band of a second communication band in Step 510 includes matching the antenna at a plurality of sub-bands in the second communication band.

A sub-band antenna matching method, an antenna matching system for selectively tuning a communication bandwidth segment impedance, and a wireless communications device with a bandwidth segment antenna matching system have been provided. The invention has been explained with exemplary matching circuitry designed for particular frequencies of operation. The present invention, however, is not limited to any particular circuit topology or frequency ranges. Other variations and embodiments of the invention will occur to those skilled in the art.

We claim:

1. An antenna matching system comprising:
an antenna having an interface port with a frequency-dependent impedance; and
a sub-band matching circuit including an output port connected to the antenna interface port, the sub-band matching circuit including:
a first tuning circuit selectively tunable to a first sub-band within a first communication band and selectively tunable to a second sub-band within a second communication band, the first tuning circuit comprising a first tunable ferroelectric (FE) capacitor having a first variable dielectric constant responsive to a first control voltage; and,
a second tuning circuit selectively tunable to a third sub-band within the first communication band when the first tuning circuit is tuned to the first sub-band and selectively tunable to a fourth sub-band within the second communication band when the first tuning circuit is tuned to the second communication band, the second tuning circuit comprising a second tunable FE capacitor having a second variable dielectric constant responsive to a second control voltage;
wherein the first tuning circuit and the second tuning circuit supply a first conjugate impedance for receiving the first communication band on the antenna interface port and supply a second conjugate impedance for receiving the second communication band on the antenna interface port.

2. The system of claim 1 wherein the sub-band matching circuit selectively supplies the first conjugate impedance at a low end of the first communication band and at a high end of the first communication band.

3. The system of claim 1 wherein the sub-band matching circuit selectively supplies the second conjugate impedance at a low end of the second communication band and at a high end of the second communication band.

4. The system of claim 2 wherein the sub-band matching circuit selectively supplies the first conjugate impedance at the low end of the first communication band in response to tuning the first tuning circuit to a first frequency within the first communication band and tuning the second tuning circuit to a second frequency within the first communication band.

5. The system of claim 2 wherein the sub-band matching circuit selectively supplies the first conjugate impedance at the high end of the first communication band in response to tuning the first tuning circuit to a third frequency within the first communication band and tuning the second tuning circuit to a fourth frequency within the first communication band.

6. The system of claim 3 wherein the sub-band matching circuit selectively supplies the second conjugate impedance at the low end of the second communication band in response to tuning the first tuning circuit to a fifth frequency within the second communication band and tuning the second tuning circuit to a sixth frequency within the second communication band.

7. The system of claim 3 wherein the sub-band matching circuit selectively supplies the second conjugate impedance at the high end of the second communication band in response to tuning the first tuning circuit to a seventh frequency within the second communication band and tuning the second tuning circuit to an eighth frequency within the second communication band.

8. The system of claim 1 wherein the first control voltage and the second control voltage are in the range of zero to three volts dc.

9. The system of claim 1 wherein the first and second tunable ferroelectric capacitors are selected from the group including interdigital, gap, and overlay capacitors.

10. The system of claim 1 wherein the first tuning circuit includes:
a first inductor with a fixed inductance value;
the first tunable FE capacitor with a first selectable capacitance value; and,
wherein the second tuning circuit includes:
a second inductor with a fixed inductance value;
the second tunable FE capacitor with a second selectable capacitance value.

11. The system of claim 10 wherein the first variable capacitor has a first terminal connected to the sub-band matching circuit output port;
wherein the first inductor is connected in shunt between a second terminal of the first tunable FE capacitor and a reference voltage;
wherein the second variable tunable FE capacitor has a first terminal connected to the first variable capacitor second terminal; and,
wherein the second inductor is connected in series between a second terminal of the second tunable FE capacitor and a sub-band matching circuit input port.

12. The system of claim 11 wherein the first inductor has an inductance of 8 nano-Henrys (nH);
wherein the first tunable FE capacitor has a capacitance in the range between 2.35 and 3.1 picofarads (pF);
wherein the second inductor has an inductance of 2 nH; and,
wherein the second tunable FE capacitor has a capacitance in the range between 1.85 and 3.5 pF.

13. The system of claim 12 wherein the first tuning circuit first frequency is responsive to a first tunable FE capacitor value of 2.35 pF, and the second tuning circuit second frequency is responsive to a second tunable FE capacitor value of 2.9 pF; and,
wherein the first tuning circuit third frequency is responsive to the first tunable FE capacitor value of 2.6 pF, and the second tuning circuit fourth frequency is responsive to the second tunable FE capacitor value of 2.6 pF;
wherein the first tuning circuit fifth frequency is responsive to the first tunable FE capacitor value of 3.1 pF, and the second tuning circuit sixth frequency is responsive to the second tunable FE capacitor value of 1.85 pF; and,
wherein the first tuning circuit seventh frequency is responsive to the first tunable FE capacitor value of 2.6 pF, and the second tuning circuit eighth frequency is responsive to the second tunable FE capacitor value of 3.5 pF.

14. The system of claim 1 wherein the sub-band matching circuit supplies the first conjugate impedance at the first communication band in the range between 824 and 894 megahertz (MHz) and at the second communication band in the range of 1850 and 1990 MHz.

15. The system of claim 1 wherein the sub-band matching circuit supplies the first conjugate impedance, with a return loss of less than 2:1, at the first communication band sub-band of approximately 45 megahertz (MHz) and at the second communication band sub-band of approximately 80 MHz.

16. The system of claim 1 wherein the sub-band matching circuit supplies the first conjugate impedance at a first plurality of sub-bands in the first communication band and supplies the second conjugate impedance at a second plurality of sub-bands in the second communication band.

17. The system of claim 1 wherein the dual-band matching circuit is a matching topology selected from the group including a tunable series element, a tunable shunt element, "L", π, "F", and combinations of the above-mentioned topologies.

18. A wireless communications device with a bandwidth segment antenna matching system, the device comprising:
a transceiver having a wireless communications port to communicate information in a first communication band;
an antenna having an interface port with a frequency-dependent impedance; and
a sub-band matching circuit including an input port connected to the transceiver wireless communications port and an output port connected to the antenna interface port, the sub-band matching circuit including:
a first tuning circuit selectively tunable to a first bandwidth segment within the first communication band and selectively tunable to a second bandwidth segment within the first communication band, the first tuning circuit comprising a first tunable ferroelectric (FE) capacitor having a first variable dielectric constant responsive to a first control voltage; and,
a second tuning circuit selectively tunable to a third bandwidth segment within the first communication band when the first tuning circuit is tuned to the first bandwidth segment and selectively tunable to a fourth segment within the first communication band when the first tuning circuit is tuned to the second bandwidth segment, the second tuning circuit comprising a second tunable FE capacitor having a second variable dielectric constant responsive to a second control voltage;

wherein the first tuning circuit and the second tuning circuit supply a first conjugate impedance for receiving a first set of frequencies in the first and third bandwidth segments and supply a second conjugate impedance for receiving a second set of frequencies in the second and fourth bandwidth segments.

19. The device of claim 18 wherein the sub-band matching circuit selectively supplies the first conjugate impedance at a low end of the first communication band and at a high end of the first communication band.

20. The device of claim 18 wherein the first control voltage and the second control voltage is in the range of zero to three volts dc.

21. The device of claim 18 wherein the first and second tunable ferroelectric capacitors are selected from the group including interdigital, gap, and overlay capacitors.

22. The device of claim 18 wherein the first tuning circuit includes:
   a first inductor with a fixed inductance value; and
   the first tunable FE capacitor with a first selectable capacitance value; and,
   wherein the second tuning circuit includes:
      a second inductor with a fixed inductance value; and
      the second tunable FE capacitor with a second selectable capacitance value.

23. The device of claim 22 wherein the first variable capacitor has a first terminal connected to the sub-band matching circuit output port;
   wherein the first inductor is connected in shunt between a second terminal of the first tunable FE capacitor and a reference voltage;
   wherein the second variable capacitor has a first terminal connected to the first tunable FE capacitor second terminal; and,
   wherein the second inductor is connected in series between a second terminal of the second tunable FE capacitor and a sub-band matching circuit input port.

24. The device of claim 23 wherein the first inductor has an inductance of 8 nano-Henrys (nH);
   wherein the first tunable FE capacitor has a capacitance in the range between 2.35 and 3.1 picofarads (pF);
   wherein the second inductor has an inductance of 2 nH; and,
wherein the second tunable FE capacitor has a capacitance in the range between 1.85 and 3.5 pF.

25. A method for sub-band impedance matching an antenna, the method comprising:
   tuning a first tuning circuit to a first sub-band within a first communication band when receiving communications in the first communication band, comprising the step of:
      applying a first control voltage using a first voltage source to a first tunable ferroelectric (FE) capacitor having a first variable dielectric constant;
   tuning the first tuning circuit to a second sub-band within a second communication band when receiving communications in the second communication band, comprising the step of:
      applying a second control voltage using the first voltage source to the first tunable FE capacitor;
   simultaneously tuning a second tuning circuit to a third sub-band within the first communication band when receiving communications in the first communication band, comprising the step of:
      applying a third control voltage using a second voltage source to a second tunable ferroelectric (FE) capacitor having a second variable dielectric constant;
   simultaneously tuning the second tuning circuit to a fourth sub-band within the second communication band when receiving communications in the second communication band, comprising the step of:
      applying a fourth control voltage using the second voltage source to the second tunable FE capacitor;
   wherein the first tuning circuit and the second tuning circuit supply a first conjugate impedance for receiving the first communication band on the antenna and supply a second conjugate impedance for receiving the second communication band on the antenna.

26. The method of claim 25 wherein the first conjugate impedance matches the antenna at a low end of the first communication band.

27. The method of claim 25 wherein the first conjugate impedance matches the antenna at a high end of the first communication band.

28. The method of claim 25 wherein the first voltage source and the second voltage source supply voltages in the range between zero and 3 volts dc.

29. The method of claim 25 wherein the first tuning circuit comprises a first inductor with a first fixed inductance value; and,
   wherein the second tuning circuit comprises a second inductor with a second fixed inductance value.

30. The method of claim 29 wherein the first tunable FE capacitor has a first selectable capacitance in the range between 2.35 and 3.1 picofarads (pF), is connected to the first inductor with the first fixed inductance value of 8 nano-Henrys (nH); and,
   wherein the second tunable FE capacitor has a second selectable capacitance in the range between 1.85 and 3.5 pF, and is connected to the second inductor with the second fixed inductance value of 2 nH.

31. The method of claim 25 wherein the first communication band is in the range of 824 to 894 MHz; and,
   wherein the second communication band is in the range of 1850 to 1990 MHz.

32. The method of claim 25 wherein the first sub-band is a plurality of first sub-bands in the first communication band; and,
   wherein the second sub-band is a plurality of second sub-bands in the second communication band.

* * * * *

UNITED STATES PATENT AND TRADEMARK OFFICE
CERTIFICATE OF CORRECTION

PATENT NO. : 7,176,845 B2 Page 1 of 1
APPLICATION NO. : 10/899218
DATED : February 13, 2007
INVENTOR(S) : Jorge Fabrega-Sanchez et al.

It is certified that error appears in the above-identified patent and that said Letters Patent is hereby corrected as shown below:

Column 13, line 46
Claim 11 should read:

--11. The system of claim 10 wherein the first variable capacitor has a first terminal connected to the sub-band matching circuit output port;
    wherein the first inductor is connected in shunt between a second terminal of the first tunable FE capacitor and a reference voltage;
    wherein the second tunable FE capacitor has a first terminal connected to the first variable capacitor second terminal; and,
    wherein the second inductor is connected in series between a second terminal of the second tunable FE capacitor and a sub-band matching circuit input port. --

Column 16, line 38
Claim 30 should read:

-- 30. The method of claim 29 wherein the first tunable FE capacitor has a first selectable capacitance in the range between 2.35 and 3.1 picofarads (pF), and is connected to the first inductor with the first fixed inductance value of 8 nano-Henrys (nH); and,
    wherein the second tunable FE capacitor has a second selectable capacitance in the range between 1.85 and 3.5 pF, and is connected to the second inductor with the second fixed inductance value of 2 nH. --

Signed and Sealed this

Twenty-fourth Day of April, 2007

JON W. DUDAS
*Director of the United States Patent and Trademark Office*